United States Patent [19]

Spencer et al.

[11] Patent Number: 4,833,790
[45] Date of Patent: May 30, 1989

[54] METHOD AND SYSTEM FOR LOCATING AND POSITIONING CIRCULAR WORKPIECES

[75] Inventors: Robert M. Spencer, San Juan Capistrano; Christopher O. Lada, Palo Alto, both of Calif.

[73] Assignee: Lam Research, Fremont, Calif.

[21] Appl. No.: 48,194

[22] Filed: May 11, 1987

[51] Int. Cl.⁴ .................................................. G01B 7/31
[52] U.S. Cl. ........................................ 33/520; 33/549; 33/644
[58] Field of Search ................. 33/520, 549, 550, 644, 33/172 E

[56] References Cited

U.S. PATENT DOCUMENTS

| | | | |
|---|---|---|---|
| 2,742,993 | 4/1956 | Hommel et al. | 33/550 X |
| 3,259,989 | 7/1966 | Wilson | 33/520 |
| 4,026,031 | 5/1977 | Siddall et al. | 33/520 X |
| 4,070,762 | 1/1978 | Siddall | 33/520 |
| 4,218,825 | 8/1980 | Asakura et al. | 33/520 |

FOREIGN PATENT DOCUMENTS 1341344 9/1963 France .................................. 33/549

Primary Examiner—William D. Martin, Jr.
Attorney, Agent, or Firm—Townsend & Townsend

[57] ABSTRACT

A system for locating and positioning wafers includes a wafer shuttle, a spindle, and a position sensor. The wafer shuttle retrieves wafers from a storage location, typically a wafer cassette, and transports the wafers to the spindle. The wafers are then incrementally rotated on the spindle, and the distance between the center of rotation and the periphery of the wafer along a linear path is measured. By using three such measurements, the distance and angle with which the center of the wafer is offset from the center of rotation may be calculated. The wafer can then be centered on the spindle by rotation and translated a proper distance by the wafer shuttle. Usually, the wafers will be further rotationally oriented so that the crystal lattice lies in a desired direction.

21 Claims, 2 Drawing Sheets

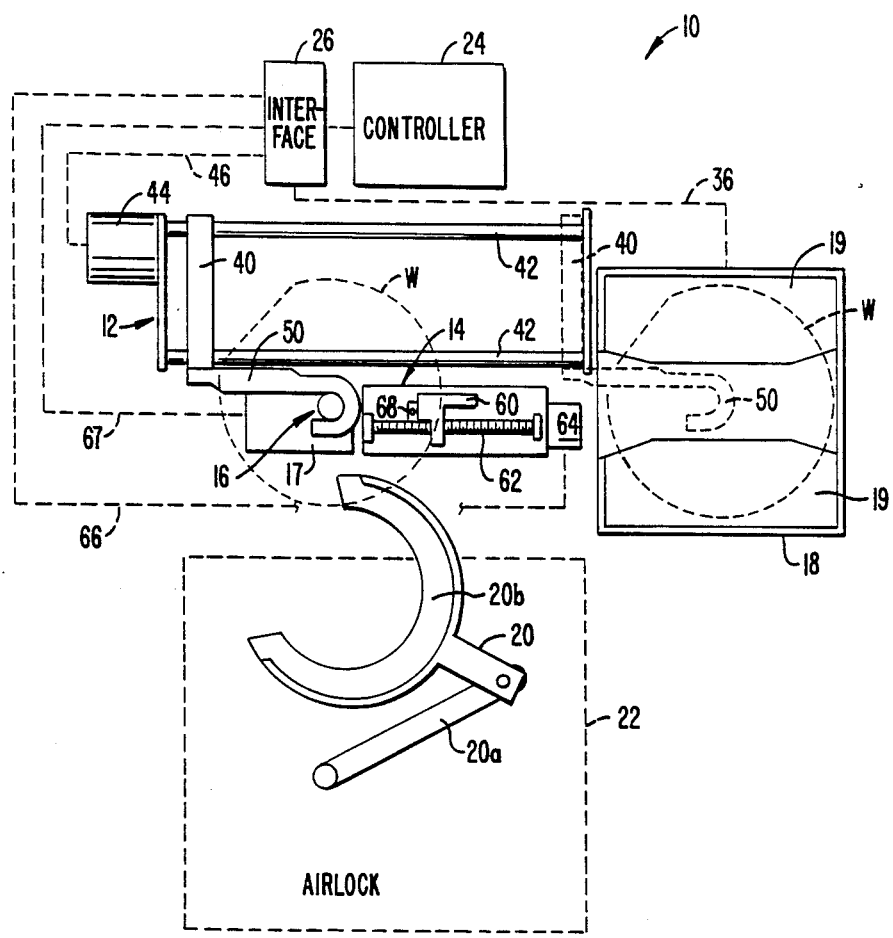
FIG._1.

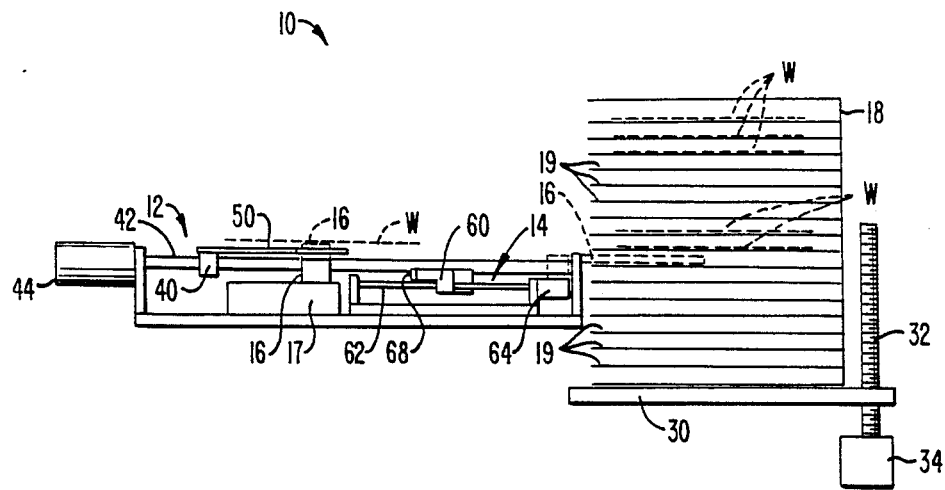
FIG.__2.
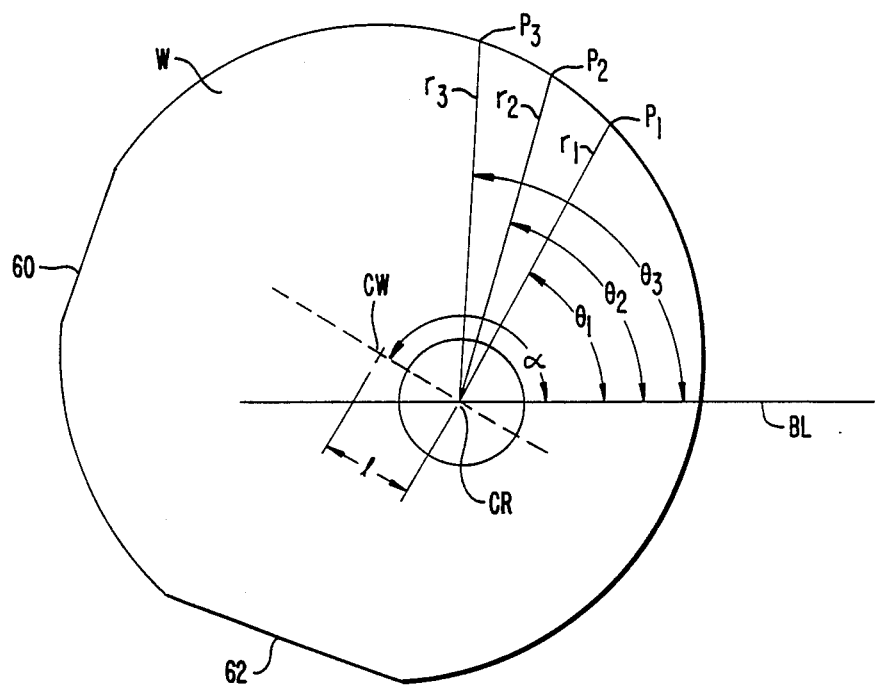
FIG.__3.

METHOD AND SYSTEM FOR LOCATING AND POSITIONING CIRCULAR WORKPIECES

BACKGROUND OF THE INVENTION

The present invention relates generally to systems and methods for the handling of workpieces. More particularly, the invention relates to a system and method for accurately locating and positioning circular workpieces, such as semiconductor wafers.

The need to locate and position circular workpieces can arise under a variety of circumstances. For example, semiconductor wafer when the retrieved from wafer cassettes are frequently not centered and are randomly oriented with regard to their crystalline lattice structure. Usually, it is necessary to position individual wafers prior to processing, such as plasma etching, chemical vapor deposition, and the like.

Unfortunately, such positioning is problematic. Prior systems have often used either fixed or movable pins to engage the periphery of the wafer and provide some degree of centering. The use of pins, however, is inaccurate, particularly when the wafer being centered has a diameter deviating from the nominal diameter. Moreover, contact with the pins causes substantial generation of particulates which is undesirable in virtually all semiconductor processes. Other systems for locating and aligning semiconductor wafers employ multiple arrays of photosensitive detectors beneath the wafer to locate its periphery. Such systems, however, require a minimum of three detector arrays and are limited by the accuracy with which those arrays may be located. Additionally, these systems require a separate mechanism for correcting the positions of the wafers subsequent to locating them.

For the above reasons, it would be desirable to provide methods and systems which are capable of accurately detecting the positions of circular workpieces, such as semiconductor wafers, and for aligning such workpieces according to preselected criteria. The method and system should be highly accurate, avoid the generation of particulates, and be able to provide true centering regardless of any deviations between the actual and nominal diameters of the wafer. In addition, the system should be relatively simple, inexpensive to build and operate, and be compatible with other material handling and processing systems, such as semiconductor wafer processing systems.

SUMMARY OF THE INVENTION

A system for locating and positioning circular workpieces, particularly semiconductor wafers, prior to subsequent manipulation and processing includes a wafer shuttle, a spindle for rotating the workpieces, and a sensor for measuring the distance between the spindle and the edge of the workpiece mounted on the spindle. The workpieces are retrieved from a remote storage container, typically a wafer cassette, and conveyed along a linear path to the spindle. The workpieces are then secured to the spindle, typically by a vacuum chuck, and incrementally rotated about a fixed center of rotation. The position of the center of the workpiece relative to that of the center of rotation is determined by measuring the distance along the linear path between the center of rotation and the periphery of the workpiece at three different angles of rotation. By applying an appropriate geometric analysis, the angle and length of offset between the center of the wafer and the center of rotation may be determined. The workpiece is then centered on the spindle by first rotating so that the line between the center of rotation and the center of the workpiece are aligned on the linear path and then translating the workpiece along the linear path by a distance equal to the length of offset so that the centers are coincident.

For semiconductor applications, it will frequently be desirable to further rotate the wafers so that their crystal lattice orientation is aligned in a preselected direction. To do so, the wafer is first rotated while the optical sensor locates certain fixed discontinuities in the periphery. Such discontinuities, usually flats and notches, indicate the type and orientation of the crystal structure. The wafer may then be rotated to the desired crystal orientation.

BRIEF DESCRIPTION OF THE DRAWINGS

FIG. 1 is a schematic layout of a system for locating and positioning semiconductor wafers constructed in accordance with the principles of the present invention.

FIG. 2 is an elevational view of the system of FIG. 1.

FIG. 3 illustrates the measurements which are made in order to determine the relative positions of the center of rotation and center of the workpiece.

DESCRIPTION OF THE SPECIFIC EMBODIMENTS

The following description relates to a system and method for the positioning of semiconductor wafers prior to subsequent manipulation and processing, such as plasma etching, chemical vapor deposition, and the like. Although the description is directed specifically at the handling of semiconductor wafers, it will be appreciated that the principles of the invention apply equally well to handling of other circular workpieces, such as recording disks, magnetic media disks, circular bioassay plates, and the like.

Referring to FIGS. 1 and 2, a positioning system 10 constructed in accordance with the principles of the present invention is illustrated. The system 10 includes a wafer shuttle 12, a position sensor 14, and a rotatable spindle 16 on a base 17. The wafer shuttle 12 is capable of retrieving wafers W from a wafer cassette 18 and transporting the wafers to the spindle 16, as will be described in more detail hereinbelow. Once at the spindle 16, the wafers W are centered and aligned in a desired orientation prior to being removed, typically by an articulated wafer transport arm 20 (including a first segment 20a and a cradle segment 20b pk capable of supporting individual wafers) which may be located in an airlock 22 asosciated with processing equipment, such as a plasma etch system, CVD reactor, or the like. Operation of the wafer shuttle 12, position sensor 14, and rotating spindle 16 are controlled by a central controller 24, typically a programmable digital computer, which communicates through an interface 26 including the necessary analog-to-digital and digital-to-analog converters.

The wafer cassette 18 is a standard cassette comprising a plurality of shelves 19 defining slots capable of receiving individual wafers W and holding them in either vertical or horizontal orientations, depending on the attitude of the cassette. In the present invention, the cassette 18 will be held so that the wafers W lie generally horizontally, with the cassette 18 placed on an elevator platform 30. As schematically illustrated, the elevator platform 30 is raised and lowered by a rotating screw 32 driven by an electric motor 34. The manner of raising and lowering the cassette 18, of course, is not critical and a wide variety of mechanisms are known and commerically available. It is necessary only that the elevation of the cassette 18 be controllable by the central controller 24, as indicated by communication line 36.

The wafer shuttle 12 includes a carriage 40 mounted to horizontally reciprocate on a pair of guide rails 42. The position of the carriage 40 on the guide rails 42 is controlled by an electric drive motor 44 which is, in turn, controlled by controller 24 as indicated by communication line 46. The manner in which the carriage 40 is driven is not critical, and may comprise a threaded drive shaft, a belt and pulley system, or the like. It is necessary, however, that the drive system be capable of accurately positioning the carriage 40 to within ±0.01 inches, preferably to within ±0.001 inches. The preferred drive system comprises a stepping motor driving a timing belt with a cogged pulley.

A J-shaped support arm 50 is secured to the carriage 40 and reciprocates along a linear path between the spindle 16 and the wafer cassette 18 as the carriage 40 is driven back and forth on the guide rails 42. At the wafer cassette 18, the distal end of the support arm 50 can be inserted beneath a wafer W, usually with a clearance of about 0.01 to 0.10 inches, usually being about 0.045 inches. Once the arm 50 is in position, the wafer cassette 18 can be lowered by lowering platform 30 so that the wafer is lifted off the support slot within the cassette 18. Usually, vacuum ports (not illustrated) will be provided in the support arm 50 for securing the wafer during transport.

After the wafer W has been lifted out of contact with the cassette 18, the wafer may be drawn back toward the spindle 16 by a motor 44 under the supervision of controller 24. The arm 50 is retracted until the J-shaped distal end lies over the spindle 16, as illustrated in full line in FIG. 1. At that time, the spindle 16 is raised (as illustrated in broken line in FIG. 2) so that the wafer W is lifted up from the support arm 50. Usually, the spindle 16 will include a vacuum port for firmly securing the wafer thereto.

At the time when the wafer W is first brought over the spindle 16, the center of rotation of the spindle and the center of the wafer W will normally not be coincident. That is, the center of the wafer W will be offset from the center of the spindle 16 by an unknown distance and in an unknown direction. Although the offset will usually be small, it can be significant in subsequent processing steps. Moreover, the crystal lattice orientation of the wafer W is usually unknown, and it is frequently desirable to provide a particular orientation prior to subsequent processing. The desired centering and rotational orientation of the wafer W may be accomplished as described hereinafter.

The position sensor 14 includes a carriage 60 mounted on a rotating drive screw 62 driven by motor 64. The motor 64 is supervised by controller 24, as indicated by communication line 66. The carriage 60 includes an optical detector 68 mounted thereon. By translating the carriage 60 back and forth on the drive screw 62, the location of the periphery of wafer W along the linear path between the spindle and the cassette may be determined. The type of optical sensor 68 employed is not critical, typically being a light emitting diode (LED) source and a phototransistor detector (not illustrated).

Raising, lowering and rotation of the spindle 16 is also supervised by controller 24 through communication line 67. In this way, rotation of the wafer can be coordinated with the measuring and positioning functions of the system 10.

Referring now to FIG. 3, the distance of offset l and the angle of offset $\alpha$, between the center of the water CW and center of rotation CR may be determined as follows. The distance $r_1$ between the center of rotation CR and a point $P_1$ on the periphery of the wafer W is measured after rotating the wafer through an angle $\theta_1$ from an arbitary baseline BL drawn through the center of rotation. The values of $r_1$ and $\theta_1$ are then stored in the controller 24. Wafer W is then further rotated through an angle $\theta_2$ relative to the baseline BL and the distance $r_2$ between the center of rotation CR and a point $P_2$ on the periphery of the wafer is measured. Similar measurements are then made for point $P_3$ which is distance $r_3$ from the center of rotation CR lying on a line displaced from the baseline BL by an angle $\theta_3$. In all cases, the measurement of the distance r is made by the position sensor 14 with the distance r lying along the linear path on which the carriage 60 travels.

Once the measurements just described are completed, the length of offset l and angular offset $\alpha$ may be calculated as follows.

$$\alpha = \tan^{-1} \frac{(r_1\cos\theta_1 - r_3\cos\theta_3) - R(r_1\cos\theta_1 - r_2\cos\theta_2)}{R(r_1\sin\theta_1 - r_2\sin\theta_2) - r_1\sin\theta_1 + r_3\sin\theta_3}$$

wherein $R = (r_1^2 - r_3^2)/(r_1^2 - r_2^2)$; and $$l = \frac{r_1^2 - r_2^2}{2((r_1\cos\theta_1 - r_2\cos\theta_2)\cos\alpha + (r_1\sin\theta_1 - r_2\sin\theta_2)\sin\alpha)}.$$

Once the offset angle $\alpha$ and offset length l have been determined, it is an easy matter to center the wafer W so that the center of the wafer CW is aligned with the center of rotation CR of spindle 16. First, the wafer is rotated so that the line between the center of rotation CR and the center of the wafer CW is aligned with the direction of the linear path traveled by support arm 50 of the wafer shuttle 12. The wafer W is then lowered onto the support arm 50 by retracting spindle 16. The support arm 50 is then translated in the direction necessary to align the center of the wafer with the center of rotation. The spindle 16 may then be raised, and the wafer is ready for further manipulation and processing.

In many cases, prior to further manipulation and processing, it will be desirable to rotationally orient the wafer W so that the crystal lattice structure lies in a desired direction. To accomplish this, it is necessary to locate certain flats or notches which are formed on the periphery of the wafer W, as exemplified by flats 60 and 62 illustrated in FIG. 3. The locations of these flats indicate the orientation of the crystal lattice structure within the wafer. The location of the flats may be determined by rotating the wafer W on spindle 16 after the wafer has been centered. The optical sensor 68 is positioned beneath the periphery of the wafer W, and will detect when the periphery appears to fall away due to the presence of a flat or other discontinuity. By storing the locations where the flats begin and end, the controller 24 can determine the precise orientation of the wafer on the spindle 16. The spindle 16 may then be rotated so that the wafer W lies in a desired crystal orientation.

Because of the provision of flats and other discontinuities on the periphery of the wafer W, the determination of the offset length l and angular offset α will be incorrect if any of the points $P_1$-$P_3$ lie on one of the flats 60 and 62. Thus, it is necessary to check the accuracy of the data generated by the above algorithms. This may be done by determining whether the calculated radius of the wafer (a) is within the expected tolerances for the type of wafer being processed. The radius a may be calculated as follows:

$$a = (r^2 + l^2 - 2rl\cos(\theta - \alpha))^{\frac{1}{2}}$$

where r may be $r_1$, $r_2$ or $r_3$ and θ may be $\theta_1$, $\theta_2$, and $\theta_3$, respectively.

Frequently, even if the calculated radius a is within the expected limits, it will be desirable to recalculate the values of offset length l and angular offset α in order to further confirm the correctness of the original calculations. This can be done using all new data points, or by substituting one or two new data points in the three data points initially utilized. In either case, if the newly calculated values of l and α agree with the originally calculated values, a very high level of confidence in the data is achieved. If the values disagree, if will be necessary to repeat the calculations until agreement is reached.

As just described, the spindle 16 and the optical detector 68 are located on the line of travel of the shuttle support arm 50. Although such configuration is preferred as it simplifies construction and operation of the system, alternative configurations are also available. For example, the spindle 50 could be laterally offset from the line of travel of the shuttle support arm 50, usually by less than one-half the expected diameter of the wafer, more usually by less than one-quarter of said diameter. The line of travel of the optical detector 68 may also be offset, either to lie parallel to the line of travel of the shuttle support arm 50, or to angularly deviate therefrom. Usually, but not necessarily, the line of travel of the optical detector 68 will be aligned with the spindle 16, regardless of the orientation relative to the line of travel of shuttle support arm 50. Such changes in the apparatus may require modification of the algorithms set forth above in order to provide for accurate positioning of the wafers.

The system and method of the present invention as just described have a number of advantages over the prior art. In particular, by contacting the wafers with vacuum pick-ups and only on their rear surfaces, damage to the wafers and the generation of particulates is minimized. Moreover, the system is highly accurate and capable of handling wafers of different diameters without any external changes in the configuration of the system. Finally, the system easily interfaces with conventional wafer handling equipment, such as wafer cassettes and wafer transport arms.

Although the foregoing invention has been described in some detail by way of illustration and example for purposes of clarity of understanding, it will be obvious that certain changes and modifications may be practiced within the scope of the appended claims.

What is claimed is:

1. A system for positioning a circular workpiece, said system comprising:

means for conveying the workpiece along a linear path;

means for rotating the workpiece about a center of rotation located on the linear path;

means for measuring the distance along the linear path between the center of rotation and the periphery of the workpiece; and means for determining the offset between the center of rotation and the center of the workpiece based on the measured distance between the center of rotation and the periphery of the workpiece at at least three different angles of rotation.

2. A system as in claim 1, wherein the means for determining the offset includes a computer and an interface between the computer and the means for conveying, the means for rotating, and the means for measuring.

3. A system for positioning a circular workpiece, said system comprising:

a cassette capable of holding a plurality of horizontal workpieces arranged in a vertical stack;

means for selecting elevating the cassette;

an arm;

means for reciprocating the arm along a linear path, with the arm extending into the cassette at one end of the path;

means on the arm for detachably securing the workpiece;

means proximate the linear path remote from the cassette for rotating the workpiece about a center of rotation on the linear path;

means for measuring the distance along the linear path between the center of rotation and the periphery of the workpiece; and means for determining the offset between the center of rotation and the center of the workpiece based on the measured distance between the center of rotation and the periphery of the workpiece at at least three different angles of rotation.

4. A system as in claim 3, wherein the means for reciprocating the arm includes at least one guide rod disposed parallel to the linear path, and means for translating the arm along the guide rod.

5. A system as in claim 3, wherein the means for detachably securing the workpiece includes a vacuum port at a remote end of the arm.

6. A system as in claim 3, wherein the means for rotating the workpiece includes a spindle and the arm includes a J-shaped end which circumscribes the spindle at a preselected position along the linear path.

7. A system for positioning a circular workpiece, said system comprising:

means for conveying the workpiece along a linear path;

a spindle located proximate the path;

means on the spindle for detachably securing the workpiece;

means for selectively elevating and rotating the spindle, whereby the workpiece may be secured, raised from the conveying means, and rotated through a desired angle;

means for measuring the distance along a line between the center of rotation and the periphery of the workpiece; and means for determining the offset between the center of rotation and the center of the workpiece baesd on the measured distance between the center of rotation and the periphery of the workpiece at at least three different angles of rotation.

8. A system as in claim 7, wherein the center of rotation is located on the linear path.

9. A system as in claim 7, wherein the distance between the center of rotation and the periphery of the workpiece is measured along the linear path.

10. A system as in claim 7, wherein the means for detachably securing the workpiece includes a vacuum port.

11. A system as in claim 7, wherein the spindle is a cylindrical shaft having a vacuum port at one end.

12. A system as in claim 11, wherein the means for selectively elevating and rotating the spindle includes a controllable motor connected to rotate the spindle.

13. A system for positioning a circular workpiece, said system comprising:
   means for conveying the workpiece along a linear path to a first location;
   means at said first location for raising the workpiece from the means for conveying and for rotating the workpiece about a center of rotation;
   a position sensor;
   means for reciprocating a position sensor along at least a portion of the linear path, whereby the distance between the center of rotation and the periphery of the workpiece may be measured; and
   means for determining the angular deviation ($\alpha$) between the linear path and a line drawn through the center of the workpiece and the center of rotation and the linear distance (l) between the center of the workpiece and the center of rotation based on the measured distance between the center of rotation and the periphery of the workpiece at at least three different angles of rotation.

14. A system as in claim 13, wherein the position sensor is an optical sensor.

15. A system as in claim 13, wherein the means for reciprocating the position sensor includes a drive screw and a carriage mounted on the drive screw.

16. A system as in claim 13, further including a controllable motor connected to rotate the drive screw.

17. A method for positioning a circular workpiece, said method comprising:
   incrementally rotating the workpiece about a fixed center of rotation where the center of rotation and the center of the workpiece are not coincident;
   measuring the distance between the center of rotation and the periphery of the workpiece at at least three different angles of rotation; and
   determining angular deviation ($\alpha$) between an arbitrary baseline drawn through the center of rotation and a line drawn through the center of the workpiece and the center of rotation and the linear distance (l) between the center of the workpiece and the center of rotation, based on said measured distances; and
   positioning the workpice by rotating through angle $\alpha$ and translating through distance l so that the center of the workpiece and the center of rotation are aligned.

18. A method as in claim 17, further including the following steps which are performed after the center of the workpiece and center of rotation are aligned:
   rotating the workpiece to detect discontinuities in its circular periphery; and
   rotationally positioning the workpiece so that the discontinuities are rotationally aligned in a preselected pattern.

19. A method as in claim 17, wherein measurement between the center of rotation and the periphery of the workpiece is repeated to confirm the determination of angular deviation $\alpha$ and distance l.

20. A method as in claim 17, wherein the angular deviation $\alpha$ is determined by the following algorithm:

$$\alpha = \tan^{-1} \frac{(r_1\cos\theta_1 - r_3\cos\theta_3) - R(r_1\cos\theta_1 - r_2\cos\theta_2)}{R(r_1\sin\theta_1 - r_2\sin\theta_2) - r_1\sin\theta_1 + r_3\sin\theta_3}$$

wherein:
   $r_1$ is the distance between the center of rotation and a point on the periphery of the workpiece when the workpiece is rotated by angle $\theta_1$ from the baseline;
   $r_2$ is the distance between the center of rotation and a point on the periphery of the workpiece when the workpiece is rotated by angle $\theta_2$ from the baseline;
   $r_3$ is the distance between the center of rotation and a point on the periphery of the workpiece when the workpiece is rotated by angle $\theta_3$ from the baseline; and $$R = (r_1^2 - r_3^2)/(r_1^2 - r_2^2).$$

21. A method as in claim 20, wherein the length l of offset is determined by the following algorithm:

$$l = \frac{r_1^2 - r_2^2}{2((r_1\cos\theta_1 - r_2\cos\theta_2)\cos\alpha + (r_1\sin\theta_1 - r_2\sin\theta_2)\sin\alpha)}.$$

* * * * *